United States Patent [19]
Howard et al.

[11] Patent Number: 5,177,402
[45] Date of Patent: Jan. 5, 1993

[54] ARC SUPPRESSOR FOR ELECTRON GUN

[75] Inventors: Glen E. Howard, Livermore; Mark A. Gesley, Oakland, both of Calif.

[73] Assignee: ETEC Systems, Inc., Hayward, Calif.

[21] Appl. No.: 816,981

[22] Filed: Jan. 3, 1992

[51] Int. Cl.[5] .................. H01J 29/96; H05B 41/14
[52] U.S. Cl. ................................ 315/1; 315/94; 315/291; 315/342
[58] Field of Search ............... 315/1, 3, 42, 57, 62, 315/69, 94, 98, 291, 326, 334, 341, 342, 343

[56] References Cited
U.S. PATENT DOCUMENTS
4,491,764  1/1985  D'Amato ..................... 315/3

Primary Examiner—David Mis
Attorney, Agent, or Firm—Skjerven, Morrill, MacPherson, Franklin & Friel

[57] ABSTRACT

An arc suppressor is provided for an electron gun of the type used e.g. in semiconductor lithography equipment. The arc suppressor prevents damaging emission properties of the electron gun either due to variation of the cathode work function or any damage to the emitter apex. The arc suppressor includes a resistance and an inductor in series with each electrode lead providing voltage or current to the various electrodes of the electron gun. The inductance is provided by a ferrite toroid which contains a plurality of holes in addition to the main central hole. The leads for each electrode are wrapped around the toroid through the various holes, with one hole being provided for each lead. Thus advantageously each lead is isolated magnetically from the others, reducing the transformer and capacitive effects that couple one lead to another.

8 Claims, 3 Drawing Sheets

ARC SUPPRESSOR FOR ELECTRON GUN

BACKGROUND OF THE INVENTION

1. Field of the Invention

This invention relates to an improvement in electron or ion ("emissive") guns and more specifically relates to suppressing undesirable arcs in such guns by providing a resistance and an inductance in series with the gun electrode leads.

2. Description of the Prior Art

Electron and ion guns are well known in various fields for instance as a source of electrons in electron beam lithography as used for fabrication of semiconductor masks and also in scanning electron microscopes, electron beam testing of integrated circuits and line width metrology measuring equipment as used in the semiconductor industry. Such guns also have application outside of the semiconductor industry, for instance in scanning electron microscopes, generally.

It is a well known deficiency of such electron guns that spurious field emissions from metallic protrusions or by electron-stimulated desorption of gas molecules cause undesirable electrical discharges, i.e. arcs. These arcs damage the emissive properties of the electron guns either due to variation of the work function, i.e., the quantity of energy needed to emit an electron by the gun or by damaging the emitter structure from which the electron currents are emitted.

One example of an electron gun is shown in copending U.S. patent application Ser. No. 07/671,425, Mark A. Gesley, "Low Aberration Field Emission Electron Gun", filed May 21, 1991.

One example of an arc suppressor in the prior art is an attachment to an electron (or ion) gun sold by FEI Co., Beaverton, OR. This arc suppressor includes a conventional single-hole ferrite toroid upon which are wound all of the leads that connect the power supply to the electron gun electrodes. Capacitors are connected between each of the leads. These leads include for example those to the filament, extractor, focus, and suppressor electrodes. The winding scheme is such that all the leads are wound together around the toroid. This configuration has the significant disadvantage that it does not fully suppress the damaging arcs and for certain electrode geometries can actually increase the energy dissipated by the arc when compared to having no arc suppressor at all. A more effective arc suppressor would be highly desirable for extending the life of the cathode electrode of the electron gun.

SUMMARY OF THE INVENTION

The object of the invention is to reduce the probability that an electrical discharge in an electron (or ion) gun or column induced by either spurious field emission from metallic protrusions or by electron stimulated desorption of gas molecules, which sputter sensitive surfaces upon ionization and subsequent impact, will damage emission properties of the electron gun either through variation of the work function or a physical change to the emitter apex from where currents are emitted. Note that arcs can originate in the column (separate from the gun itself) and then propagate to the gun where damage may occur. A difficulty to be overcome is the short time duration of the undesirable arc. Past inability to characterize the nature of the arc by direct measurement has impeded efforts to limit the magnitude of this effect. The advantage to be gained by this invention is longer cathode life.

The advantage of this invention lies in the nature of the electron gun arc suppressor. Measurements have quantified the improved operation compared to no arc suppressor present in the electron gun high voltage power supply circuit and to one other arc suppressor, which is that commercially available from FEI Co. The present arc suppressor is a resistive-inductive-capacitive (RLC) circuit that is placed in series between each of the electron gun electrodes and their high voltage power supply (HVPS). This arc suppressor uses a novel topology for the inductive ferrite toroid upon which the individual electrode leads are wrapped. The toroid (doughnut-shape) has six smaller holes that allow each lead to be wrapped in effect on its own individual ferrite core. This magnetically isolates each lead from the others, hence reducing the transformer and capacitive effects that in the prior art couple one lead to another. By isolating each lead, the induced voltage of an arc is reduced, thereby decreasing the probability of cathode damage. The ferrite toroid acts as an inductor to isolate the gun electrodes (a) from capacitively-stored charge in the leads and the HVPS that can rapidly discharge and damage the gun cathode, and (b) from each other by preventing inductive coupling between each of the leads. By using separate inductors the mutual inductance of the circuit is reduced. This avoids the undesirable transformer configuration, such as found in the prior art FEI design, where each electrode lead shares the same flux path.

Also in accordance with the invention, use of high resistance in series with each electrode resistance (greater than 10 K ohms resistance)) further dampens the induced voltage of the arc.

The arc suppressor also minimizes capacitance to reduce the stored electrical energy, which is discharged during an arc and increases the damage to the sensitive cathode in an electron (or ion) gun. This is achieved by (i) the use of short leads between the gun and the toroid and (ii) separation of the leads from each other on the toroid.

DETAILED DESCRIPTION OF THE INVENTION

Figure 1:
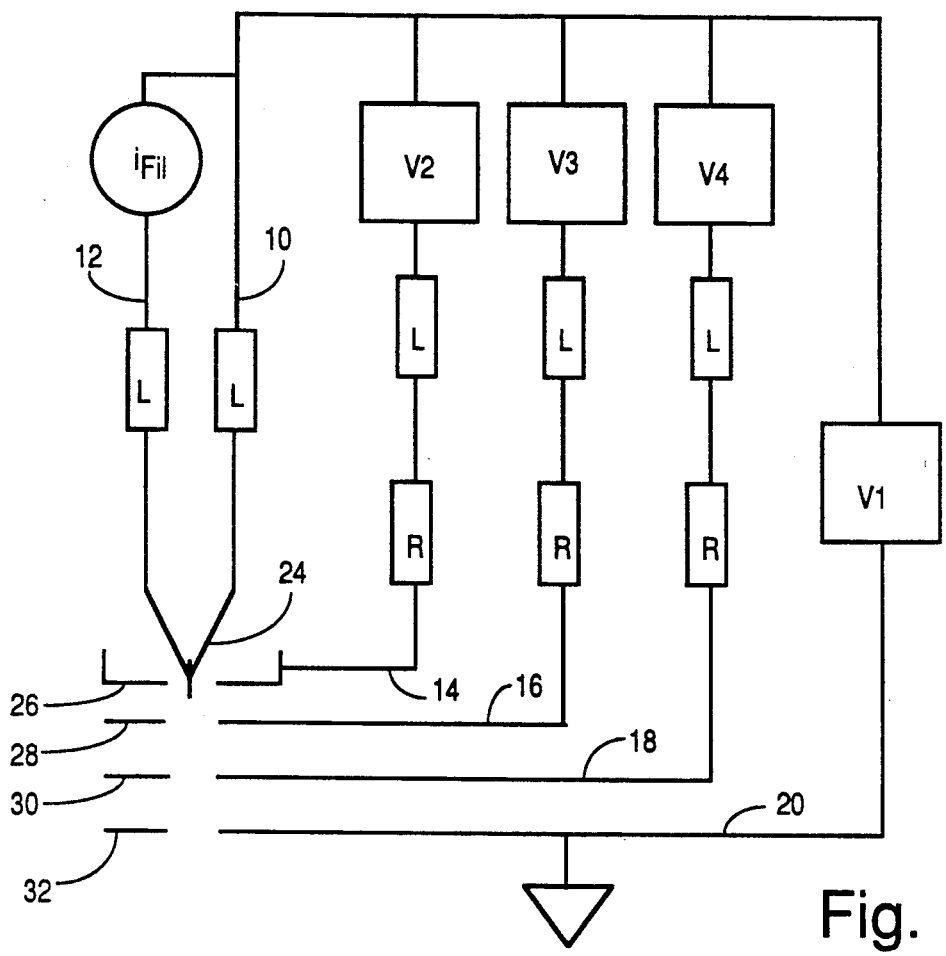
FIG. 1 schematically shows an arc suppressor in accordance with the present invention.

FIG. 1 is a schematic diagram of the configuration of the electron gun with conventional high voltage power supplies which each represent conventional voltage sources as used in typical electron gun power supplies.

$V_1$ is the beam (cathode) voltage supply, $V_2$ is the suppressor voltage supply, $V_3$ is the extractor voltage supply and $V_4$ is the focus voltage supply. These voltages are provided respectively to leads 10, 12, 14, 16, 18, 20 by the HVPS for the connected associated gun electrodes 24, 26, 28, 30, 32. The number of such power supplies varies with the number of gun electrodes and typically ranges from one to five. FIG. 1 thus depicts the gun electrodes as found in a typical three-element electrostatic gun lens: a cathode 24 (connected to a current source /FIL), suppressor or grid electrode 26, extractor electrode 28, focus 30, and anode 32. The filament current source ;FIL floats at the beam voltage and typically supplies up to three amps for resistively heating the cathode. The arc suppressor provides an additional resistive-inductive element in series with each gun electrode (except for the anode 32) and associated power supply. The power supplies $V_2$, $V_3$, $V_4$ are shown "floating off" the beam power supply $V_1$, but can also be referenced to ground.

The resistance in series with each electrode in FIG. 1 (denoted by the symbol R) is in one embodiment the above-mentioned 25 K ohms. The actual component that provides this resistance in one embodiment is highly resistive automotive wire having a resistance of 6.6 K ohms per linear foot. The inductors L in FIG. 1 are all a part of one multi-hole ferrite toroid (not shown). Each symbol L represents an individual electrode lead 10, 12, 14, 16, 18 wrapped through its own particular hole in the ferrite toroid as described further below. The inductive reactance of each lead 10, 12, 14, 16, 18, 20 is 17 K ohms at 10 KHz, 16 K ohms at 100 KHz, and 1 K ohm at 10 MHz.

Figure 2:
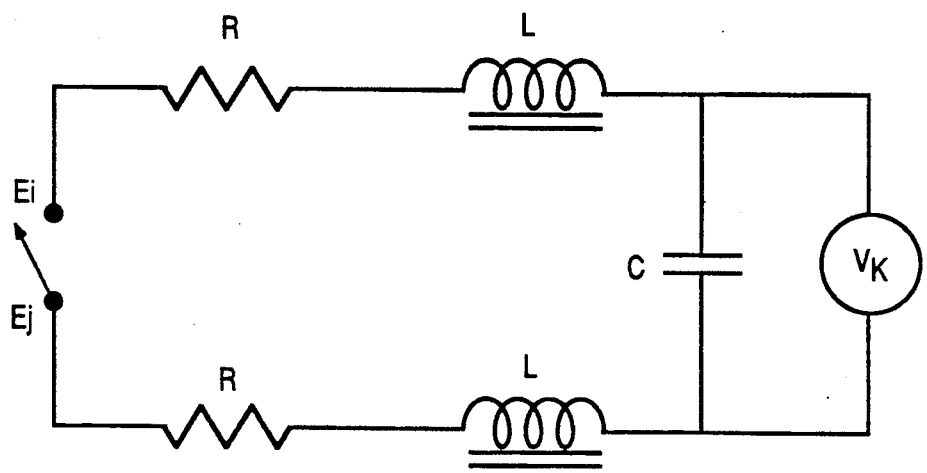
FIG. 2 shows an equivalent circuit for a portion of the apparatus of FIG. 1.

FIG. 2 shows an equivalent RLC-circuit for a pair of electrodes, e.g. electrodes 14 and 16 of FIG. 1. FIG. 2 is thus a partial equivalent circuit for the electron gun arc suppressor and voltage supply. One or a combination of the voltage supplies of FIG. 1 is represented by $V_k$, where k=1, 2, 3, or 4 as shown in FIG. 1. The single C represents the distributed lead capacitance. L represents the inductance provided by the toroid. R is the resistance provided by the resistive wire as discussed above. Symbols $E_I$, $E_J$ represent any two adjacent electrodes i.e., for instance I equals the cathode and J equals the extractor, or I equals the extractor and J equals the focus electrode. The switch symbol represents the action of the undesirable arc; therefore when there is an electrical discharge the switch is in its closed position. The inductance (L) is provided by the ferrite toroid upon which each electrode lead is wrapped. The upper limit to the resistance is set by the specification to which the potential at the electrode $E_k$ must be kept within the actual output of the power supply $V_1$ and to the amount of permissible temperature dependent voltage drift of the resistance.

Figure 3:
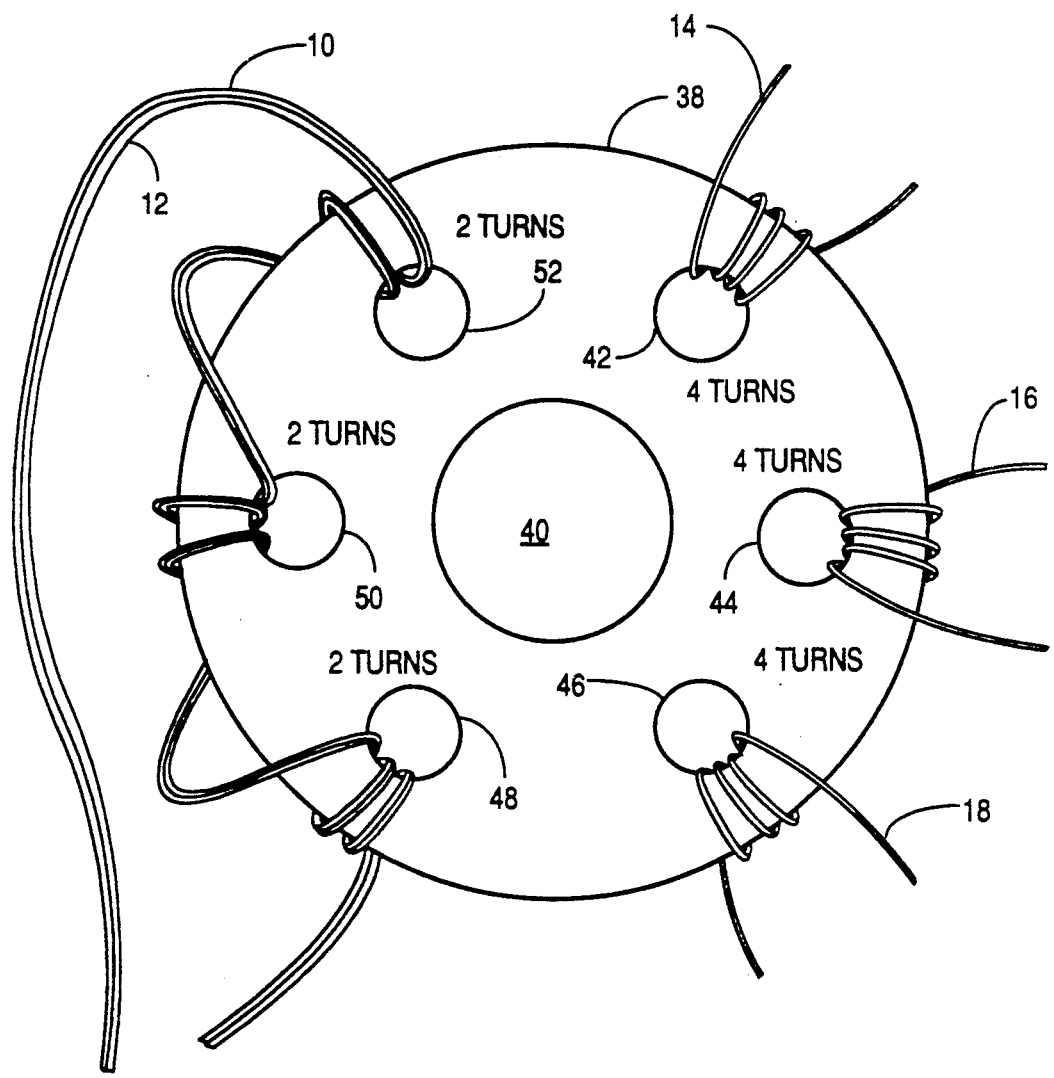
FIG. 3 shows the inductor for the apparatus of FIG. 1.

FIG. 3 shows the ferrite toroid 38 which is the "L" of FIG. 1 with a conventional central hole 40 and additional holes 42, 44, 46, 48, 50, 52 through which each individual lead 10, 12, 14, 16, 18 is wrapped. In FIG. 3 each lead is wound on a separate hole of the multi-hole toroid 38. This configuration isolates the flux generated by each of the leads from the flux generated by the other leads.

The lead length between the gun and arc suppressor for each electrode is about four inches. This is a significant reduction over the prior art lead length which is typically six inches to four feet. Also, (as described above) in the prior art FEI arc suppressor, capacitors which are placed inside the arc suppressor connect various leads to each other. In the present preferred embodiment these capacitors are eliminated to further reduce the capacitance of the entire structure. This reduces the stored electrical energy in the unit and thus greatly diminishes the possibility of the arc damaging the gun and particularly damaging the cathode.

As discussed above, the toroid of FIG. 3 is represented by the L inductor symbol in FIG. 1. Each L in FIG. 1 represents an individual lead wound around its own hole in the multi-hole toroid of FIG. 3. The two L's associated with the filament leads 10, 12 in FIG. 1 represent the bifilar winding 10, 12 on a single hole 52 in FIG. 3. Bifilar means there are two filament leads wound together as a pair on an individual hole 48, 50, 52 as shown in FIG. 3. Two filament leads and hence two inductors are needed because a filament heating circuit is used typically to bring the cathode to a high temperature. However, this arc suppressor is also suitable for use with a cold field emitter, i.e., an unheated emitter, to prevent arcing. Therefore, while the preferred embodiment is for a thermal field or a "Schottky" type electron gun, the invention is not restrictive to this type and is suitable for use in an electron gun having a cold field emitter or an $LaB_6$ type electron source.

The toroid 38 material is an MN67 ferrite. The dimensions of the toroid are 4.5 inches (11.43 cm) overall outside diameter, and one inch (2.54 cm) thick. The central hole 40 is 0.56 (1.42 cm) inches in diameter. The other six holes 43, . . . , 52 are distributed at 60° intervals equally around the toroid. Each of the holes 42, . . . , 52 is 0.75 inches (1.90 cm) in diameter and these holes are each centered on a circle 2.5 inches (6.35 cm) in radius. The number of turns of each electrode lead are as shown in this embodiment are four turns of each of the electrode leads 10, 12, 14 except for the emitter leads 16, 18 which are two turns around each of the three holes. This number of turns has been determined to the effective at suppressing arcs. The toroid 38 is mounted on the top flange of the electron gun in close proximity, i.e., within four inches (about 10 cm) of the electrode feedthroughs where connection is made to the electrode leads. The wire used for the electrode leads is 16 AWG high voltage silicone lead wire No. R790-4516 from Rowe Industries. The toroid 38 is fabricated with the additional holes by conventional machining procedures.

Figure 4:
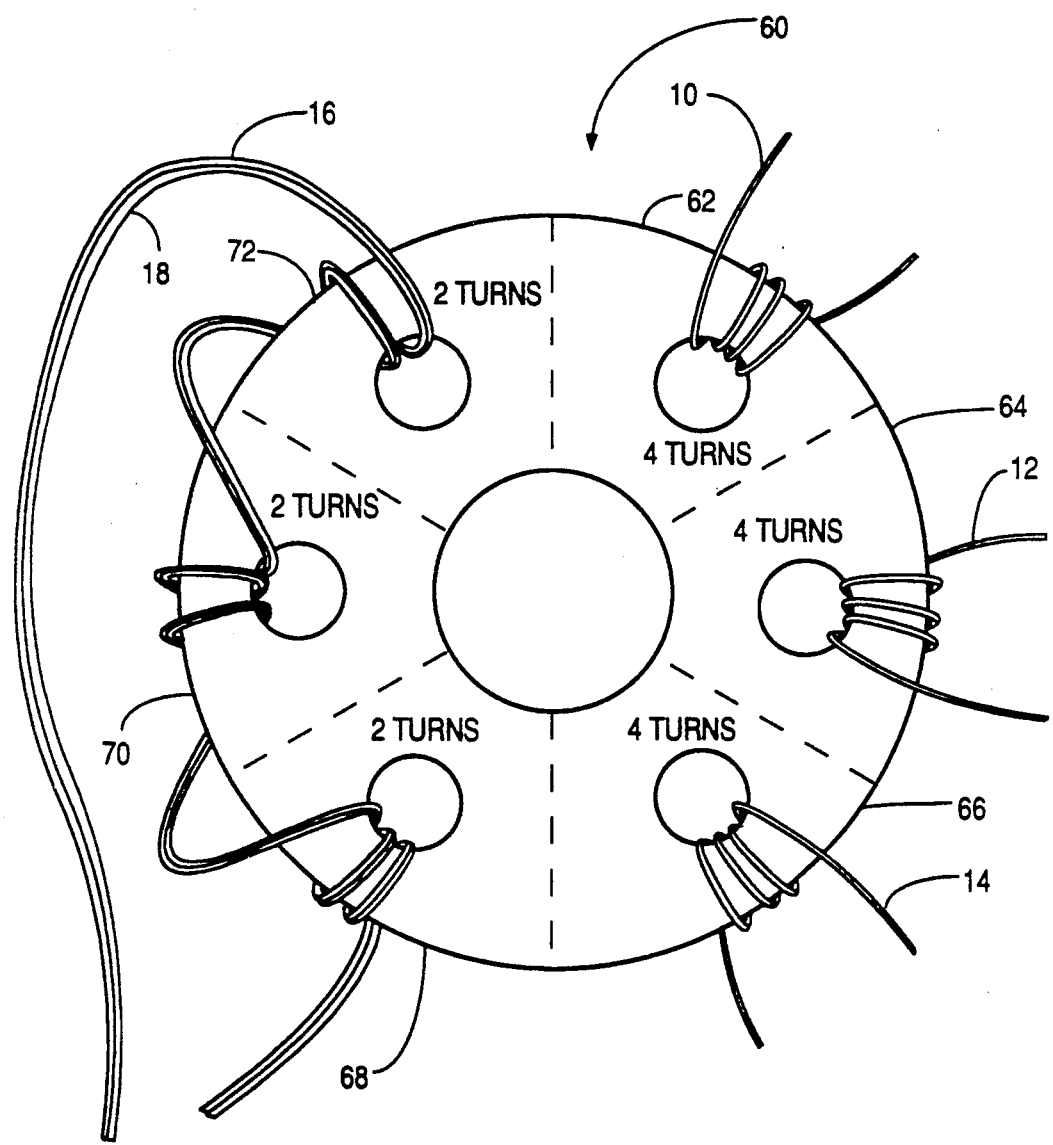
FIG. 4 shows an alternate inductor for the apparatus of FIG. 1.

Another configuration of a toroid 60 in accordance with the invention is shown diagrammatically in FIG. 4. This is a modification of the structure of FIG. 3 wherein the dashed lines represent cuts in the toroid 60 that when physically separated along the dashed lines create a separate individual single hole toroid 62, 64, . . . , 72 for each lead. The disadvantage of this configuration is that it is physically less compact than that of FIG. 3, depending on the actual physical arrangement of the individual toroids. This individual toroid configuration thus has the toroid divided into (for example) individual ferrite rings 62,...72, one for each electrode lead 10, 12, 14, 16, 18. Again, because the cathode lead is often accompanied by a floating heating circuit that requires two leads 16, 18 rather than one lead associated with this particular electrode, the two leads 16, 18 are wrapped in a bifilar manner on the same toroid rings 60, 70, 72.

Table I provides a comparison of the effect that arcs have on an inductively detected voltage measured at each of the electrode leads for the arc suppressor of FIG. 3 ("This disclosure"), the prior art FEI device, and none; the units in Table 1 are in volts.

TABLE I

Attenuated Peak to Peak Arc Voltage: induced at 12.8 kV extraction voltage and detected with an inductive probe with the ACCEL gun run in DECEL mode at 26 kV beam voltage. Average arc duration 1 μsec.

| Suppressor-type | Focus | Filament | Extractor | Suppressor |
|---|---|---|---|---|
| This disclosure | 2.8 | 0.5 | 1.2 | 0.6 |
| FEI | 16.8 | 13.4 | 20 | 1.8 |
| None | 9.7 | 1.6 | 10 | 6.3 |

TABLE I-continued

Attenuated Peak to Peak Arc Voltage: induced at
12.8 kV extraction voltage and detected with an
inductive probe with the ACCEL gun run in DECEL
mode at 26 kV beam voltage. Average arc duration 1 μsec.

| Suppressor-type | Focus | Filament | Extractor | Suppressor |
|---|---|---|---|---|
| Arc Voltage Ratio FEI/This disclosure | 6.0 | 28 | 17 | 3 |
| Voltage Difference Between: | | | Filament/ Extractor | |
| This disclosure | | | 0.5 | |
| FEI | | | 5.0 | |
| None | | | 10.0 | |

Table I shows the voltage detected at a storage oscilloscope taking the voltage measurement in a step down by a 100:1 divider; the voltages are proportionate to the time rate of change of the discharged current and also proportional to the inductance. As shown this is the attenuated peak-to-peak arc voltage induced at 12.8 kV extraction voltage and detected with an inductive probe with an "ACCEL" electron gun operated in "DECEL" mode and 26 kV beam voltage. "ACCEL" and "DECEL" are described in above-cited copending application Ser. No. 07/671,425. Briefly, the "ACCEL" configuration has slightly different dimensions but a similar electrode geometry compared with a DECEL gun. The average arc duration was one microsecond. The arc suppressor of the present disclosure, FEI prior art version, and gun with no arc suppressor are compared. Table I tabulates the results in volts of attenuated peak-to-peak arc voltage for an electron gun operated at 26 kV beam voltage. In all cases the present arc suppressor resulted in the largest arc-induced voltage reduction (i.e., smallest voltage). In the cases of measuring the focus, filament, and extractor, the prior art FEI arc suppressor actually had a higher induced voltage than the case where no arc suppressor was used at all. This shows that the prior art device did not apply the present high speed measuring method to actually determine whether that configuration actually had a beneficial effect on reducing arc energy.

This disclosure is illustrative and not limiting; further modifications will be apparent to one skilled in the art in light of this disclosure and the appended claims. One possible modification is to use a multiferrite toroid (having two ferrites of different resistivity and inductance) to improve the broadband frequency response.

We claim:

1. An emissive gun with arc suppression comprising:
   a plurality of high voltage electrodes;
   a lead for providing voltage to each electrode from a feed-through; and
   at least two independent flux paths, each juxtaposed to one of the leads for arc suppression.

2. The device of claim 1, further comprising a resistor series connected to each of the leads.

3. The device of claim 1, wherein each lead is less than about four inches long.

4. The device of claim 1, further comprising:
   a toroid defining a plurality of through-holes, at least one of the leads being wrapped around a portion of the toroid defined by each of the through-holes, thereby establishing the independent flux path for each lead.

5. The device of claim 1, further comprising a plurality of individual inductor bodies, at least one of the leads being wrapped around a portion of each inductor body, thereby establishing the independent flux path associated with each lead.

6. The device of claim 1, wherein each resistor is about 25 k ohms

7. An emissive gun with arc suppression comprising:
   a plurality of high voltage electrodes;
   a lead for providing voltage to each electrode from a feedthrough;
   a toroid defining a plurality of through-holes, at least one of the leads being wrapped around a portion of the toroid defined by each of the through-holes; and
   a plurality of resistors, each resistor being series connected to one of the leads.

8. A method of suppressing arcs in an emissive gun having a plurality of electrodes, each electrode being connected to a lead for providing voltage to the electrode, comprising the steps of:
   providing an independent flux path juxtaposed to each of the leads; and
   providing a resistor series connected to each of the leads.

* * * * *

UNITED STATES PATENT AND TRADEMARK OFFICE
CERTIFICATE OF CORRECTION

PATENT NO.   :   5,177,402
DATED        :   January 5, 1993
INVENTOR(S)  :   Glen E. Howard and Mark A. Gesley It is certified that error appears in the above-identified patent and that said Letters Patent is hereby corrected as shown below:

Col. 4, line 29, change "determined to the" to --determined to be--.
Column 6, line 1,
In claim 6, change "each resistor is 25 about 25 k ohms" to --each resistor is about 25 k ohms.--.

Signed and Sealed this

Twenty-eighth Day of December, 1993

Attest:

BRUCE LEHMAN

*Attesting Officer*     *Commissioner of Patents and Trademarks*